United States Patent
Reignoux et al.

(10) Patent No.: US 7,208,822 B1
(45) Date of Patent: Apr. 24, 2007

(54) INTEGRATED CIRCUIT DEVICE, ELECTRONIC MODULE FOR CHIP CARDS USING SAID DEVICE AND METHOD FOR MAKING SAME

(75) Inventors: Yves Reignoux, La chapelle Saint Mesmin (FR); Eric Daniel, Saint Jean le Blanc (FR)

(73) Assignee: Axalto SA, Meudon (FR)

( * ) Notice: Subject to any disclaimer, the term of this patent is extended or adjusted under 35 U.S.C. 154(b) by 0 days.

(21) Appl. No.: 09/890,226

(22) PCT Filed: Jan. 18, 2000

(86) PCT No.: PCT/FR00/00098

§ 371 (c)(1),
(2), (4) Date: Jun. 7, 2002

(87) PCT Pub. No.: WO00/45434

PCT Pub. Date: Aug. 3, 2000

(30) Foreign Application Priority Data

Jan. 27, 1999 (FR) .................. 99 00858

(51) Int. Cl.
*H01L 23/02* (2006.01)
*H01L 23/10* (2006.01)
*H01L 23/48* (2006.01)

(52) U.S. Cl. .............. 257/679; 257/686; 257/707; 257/777

(58) Field of Classification Search .......... 257/679, 257/686, 707, 777, 723, 784; 438/106–127, 438/612, 613, 614–617
See application file for complete search history.

(56) References Cited

U.S. PATENT DOCUMENTS

| | | | | |
|---|---|---|---|---|
| 4,603,249 A | * | 7/1986 | Hoppe et al. | 235/492 |
| 4,774,633 A | * | 9/1988 | Dehaine et al. | 361/751 |
| 4,803,542 A | * | 2/1989 | Haghiri-Tehrani et al. | 257/679 |
| 4,975,761 A | * | 12/1990 | Chu | 257/686 |

(Continued)

FOREIGN PATENT DOCUMENTS

EP  0 508 266 A1  10/1992

(Continued)

OTHER PUBLICATIONS

Patent Abstracts of Japan, Publication No. 60091489, dated May 22, 1985.

(Continued)

*Primary Examiner*—Douglas W. Owens
*Assistant Examiner*—Samuel A Gebremariam
(74) *Attorney, Agent, or Firm*—Osha Liang LLP

(57) ABSTRACT

This invention relates to an integrated circuit device, in particular for manufacturing smart card electronic units for smart cards. It comprises:
an active layer (32) including a semiconductor material within which integrated circuits are formed and having a face (34) provided with a plurality of electrical connection terminals (36) and a second face, wherein said face has a thickness smaller than 100 µm, and
a complementary layer (40) having a first face (42) attached to the active face of the active layer, a second face (44) and a side surface (48), wherein said complementary layer includes a plurality of recesses (46), each recess extending through the whole thickness of the complementary layer, and extending from a contact terminal (36) to said side surface (48).

9 Claims, 3 Drawing Sheets

U.S. PATENT DOCUMENTS

| | | | | |
|---|---|---|---|---|
| 5,155,068 A | | 10/1992 | Tada | 437/211 |
| 5,422,435 A | * | 6/1995 | Takiar et al. | 174/52.4 |
| 5,648,684 A | * | 7/1997 | Bertin et al. | 257/685 |
| 5,777,391 A | | 7/1998 | Nakamura et al. | 257/778 |
| 5,811,877 A | | 9/1998 | Miyano et al. | 257/706 |
| 5,834,755 A | * | 11/1998 | Haghiri-Tehrani et al. | 235/492 |
| 5,877,544 A | * | 3/1999 | Rigal et al. | 257/679 |

FOREIGN PATENT DOCUMENTS

| | | |
|---|---|---|
| EP | 0 712 159 A2 | 5/1996 |
| JP | 60-91489 | 5/1985 |
| JP | 2-2095 | 1/1990 |
| JP | 4-207061 | 7/1992 |
| JP | 4-341896 | 11/1992 |

OTHER PUBLICATIONS

Patent Abstracts of Japan, Publication No. 04341896, dated Nov. 27, 1992.

Patent Abstracts of Japan, Publication No. 04207061, dated Jul. 29, 1992.

Patent Abstracts of Japan, Publication No. 02002095, dated Jan. 8, 1990.

* cited by examiner

INTEGRATED CIRCUIT DEVICE, ELECTRONIC MODULE FOR CHIP CARDS USING SAID DEVICE AND METHOD FOR MAKING SAME

CROSS-REFERENCE TO RELATED APPLICATIONS

This patent application claims priority from French Patent Application No. 99/00858, filed on Jan. 27, 1999.

FIELD OF THE INVENTION

The present invention relates to an integrated circuit device, an electronic unit for smart cards using the integrated circuit device and a method for manufacturing said device.

More specifically, the present invention relates to the manufacturing of a semiconductor chip in which integrated circuits are formed, having a structure such that electronic units for smart cards of reduced thickness can be manufactured.

BACKGROUND OF THE INVENTION

It is known that smart cards used in particular as banking cards, such as an identification card, or also as a payment card for different services, are essentially made of a plastic material body of rectangular parallelepiped shape in which is inserted an electronic unit most often made of a semiconductor chip attached to an insulating substrate provided with external electrical contact pads. These external pads enable electrical connection between the circuits in the semiconductor chip and circuits in a read-write device when the card is inserted within such a device.

According to the prevailing standards, the card body should have a thickness of about 0.8 mm. It should be understood that the thickness of the electronic unit is therefore one of its critical parameters, and facilitates the insertion of the electronic unit within the card body and ensures a proper mechanical coupling between the card body and the electronic unit as well as the mechanical integrity of the electronic unit.

In the appended FIG. 1, a vertical cross section of an electronic unit for smart cards made according to a known technique is shown. Electronic unit 10 is essentially comprised of a semiconductor chip 12 in which integrated circuits are formed, this chip having an active face 14 provided with electrical connection terminals 16. The semiconductor chip 12 is attached to an insulating substrate 18 through an adhesive layer 19. The external face 18a of the insulating substrate is provided with external contact pads 20 to be contacted with the electrical contacts of the read-write device. Terminals 16 of chip 12 are connected to external pads 20 through leads such as 24. According to a known method, the insulating substrate comprises windows 28 with electrical leads 24, so that the use of a doubled-faced printed circuit is avoided. In order to ensure electrical integrity of chip 12 and electrical leads 24, they are encapsulated with an insulating material 26 such as an epoxy resin.

In some cases, the wire leads can be replaced with other electrically conducting elements for connecting the chip terminals to external pads on the insulating substrate.

With such a manufacturing technology, an electronic unit having an overall thickness of about 0.6 mm, is obtained, to be compared with the 0.8 mm thickness of the card body.

Techniques that would allow reducing this thickness are difficult to implement. They could consist in reducing the chip thickness, which is conventionally of the order of 180 μm, but this would unacceptably reduce chip strength. One could also reduce the thickness caused by the curvature of electrical wires 24 or similar electrical connection elements. This, however, requires using the so-called "Wedge bonding" technology which is of costly implementation. Finally, it could be contemplated to reduce the thickness of the insulating resin of encapsulation 26. Such a reduction would however reduce the strength of the electronic unit as a whole.

SUMMARY OF THE INVENTION

U.S. Pat. No. 5,155,068 discloses a method of manufacturing an electronic unit for smart cards. According to this method a semiconductor chip comprises an active face provided with metallic wire layers. Connections are formed between these metallic wire layers and a substrate provided with electrical contacts. An acryl or epoxy resin is then applied for attaching the semiconductor chip to the substrate with its electrical contacts. The method is of costly implementation.

A first objet of the present invention is to provide an integrated circuit device permitting the manufacturing of an electronic unit for smart cards having a reduced thickness while not having the drawbacks of the above-mentioned techniques.

To achieve this object, according to the invention, the integrated circuit device is characterized in that it comprises:

an active chip of a semiconductor material comprising an electrical circuit, the active chip having an active face provided with a plurality of electrical connection terminals and a second face, wherein the chip has a thickness of less than 100 μm, and a complementary chip having a first face attached to the active face of the active chip, a second face and a side surface, wherein the complementary chip has a plurality of recesses, each recess extending through the whole thickness of the complementary chip and extending from above a contact terminal to said side surface.

An electronic unit for smart cards can be realized from such an integrated circuit device. The electronic unit further comprises an insulating substrate having an outer face provided with outer electrical contact pads and an inner face, the second face of the active chip being attached to the inner face of the substrate, and a plurality of electrical leads, each lead having a first end connected to a contact terminal and a second end connected to an external contact pad and lying entirely between the plane containing the second face of the complementary chip and the insulating substrate.

It should be understood that, due to the reduced thickness of the active layer, on the active face of which contact terminals are formed, these contact terminals are close to that face of the integrated circuit device which is attached to the insulating substrate when the electronic unit is formed. It should also be understood that, due to the presence of recesses which open into the side surface of the complementary layer, it is possible, when forming the electronic unit, to provide connection in the electric wires which are integrally provided below the plane that includes the upper face of the complementary layer. It should be understood that the resulting thickness of the electronic unit is substantially reduced relative to the thickness of an electronic unit of the previously described type.

The present invention also relates to a method for manufacturing an integrated circuit device from:

an active chip of a semiconductor material comprising an electrical circuit, the active chip having an active face provided with a plurality of electrical connection terminals and a second face, and a complementary chip having a first face, a second face and a side face, the complementary chip including a plurality of recesses, each recess extending through the whole thickness of the complementary chip, wherein the method is characterized in that it comprises the following steps:

an attachment step wherein the first face of the complementary chip is attached to the active face of the active chip so that a recess of the complementary chip extends from above a contact terminal of the active chip to the side surface of the complementary chip; and an etching step wherein the active chip is etched from its second face so as to provide it with a thickness of less than 100 µm.

It should be understood that according to this method, the starting element is an active layer having a standard thickness, namely about of 180 µm, which active layer is attached to the complementary layer, which itself has a certain thickness. Thus, an assembly is obtained with a sufficient thickness for etching the non-active face of the active layer while complying with overall dimensions such that the assembly maintains a sufficient mechanical strength.

Other features and advantages of the present invention will be apparent from the following detailed description of an embodiment of the invention given by way of non limiting example in reference to the accompanying drawings, in which:

DETAILED DESCRIPTION

Figure 1:
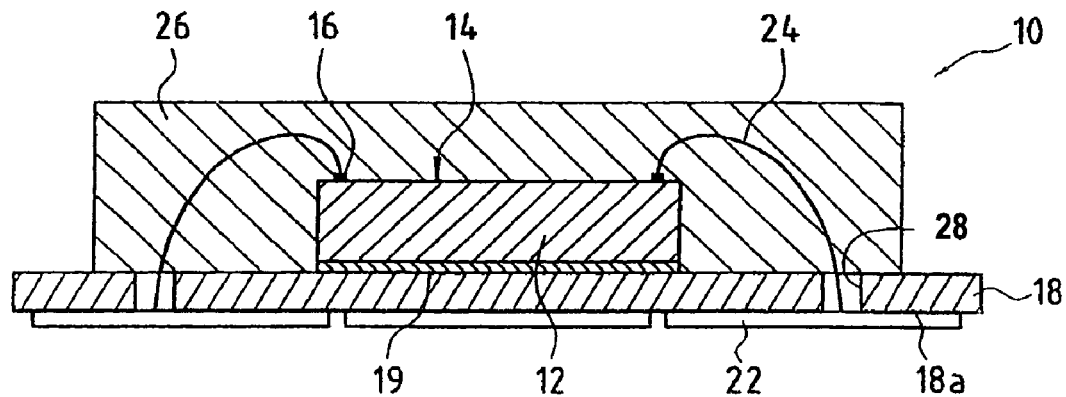
FIG. 1, already described, shows a vertical cross-section of an electronic unit for a standard smart card.
Figure 2A:
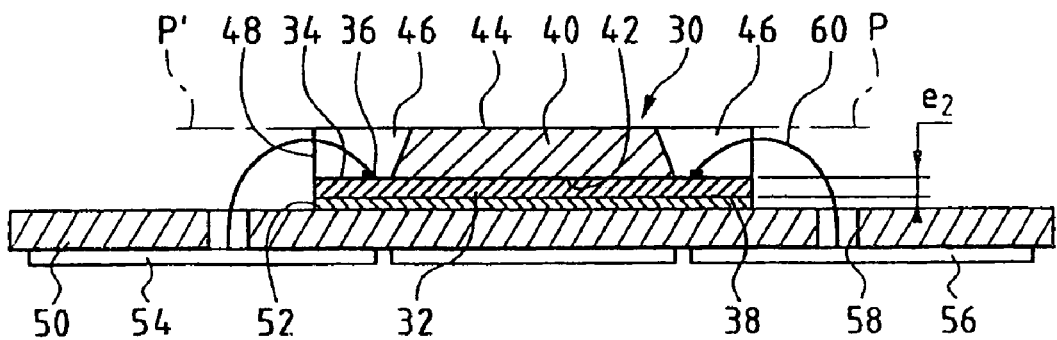
FIGS. 2a and 2b show a vertical cross-section of two manufacturing steps of the electronic unit according to this invention.
Figure 2B:
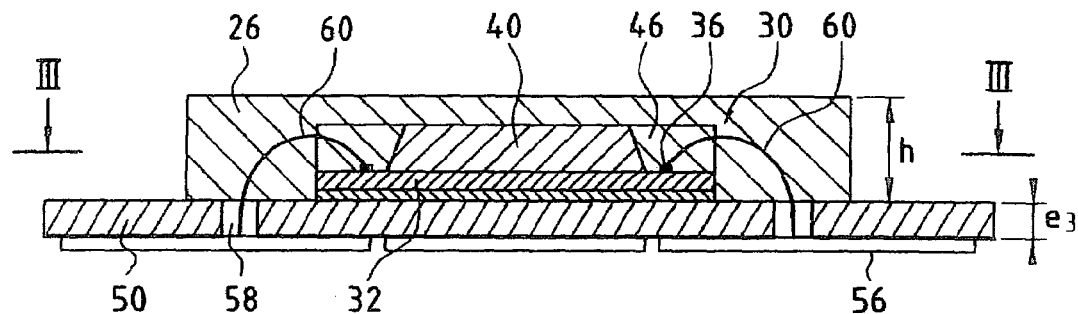
Figure 3:
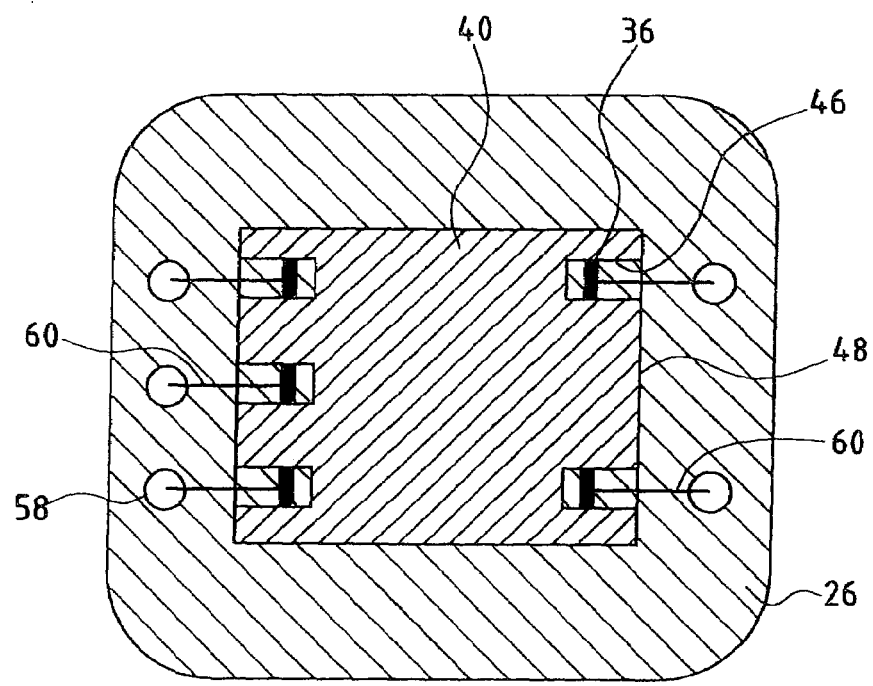
FIG. 3 shows a horizontal cross-section of the electronic unit along line III—III of FIG. 2b.

Referring first to FIGS. 2 and 3, a description will be given of the integrated circuit device or electronic chip and the electronic unit using the same.

Detailed Description

The integrated circuit device 30 is essentially comprised of an active layer 32 of a semiconductor material, typically silicon, into which the different integrated circuits are formed. This active layer 32 has an active face 34 into which electric contact terminals and an attachment face 38 are formed. The integrated circuit 30 also comprises a complementary layer 40 whose first face 42 is attached through any appropriate means, for example, an intermediate sealant layer formed of a polyimide, to the active face of active layer 32 and whose upper face 44 is free. Complementary layer 40 may also be advantageously made of silicon, but other materials having physical characteristics similar to silicon, in particular in what concerns it thermal expansion coefficient, could be used. One of the functions performed by complementary layer 40 is to form a protective layer against fraud attempts that could be performed with respect to the active layer integrated circuits.

As more clearly shown in FIG. 3, complementary layer 40 is provided with recesses such as the one shown in 46 (in the given example, there are five connection terminals 36 and five recesses 46). Each recess 46 extends over the whole thickness of the complementary layer and extends from contact terminal 36 to the side surface 48 of complementary layer 40. In other words, these recesses open laterally into the complementary layer.

According to the above described embodiment, the thickness $e_1$ of the complementary layer is 140 µm and the thickness $e_2$ of the active layer is 40 µm. Thus, the total thickness of the integrated circuit device is 180 µm, which corresponds to the thickness of a standard semiconductor chip.

More generally, the thickness of the active layer is less than 100 µm, which reduced thickness can be obtained by resorting to the manufacturing method described below. Still preferably, thickness $e_2$ of the active layer ranges from 5 to about 50 µm.

The thickness of the active layer is thus significantly greater than that of the semiconductor chip. In particular, this leads to a thinner unit, since the lead wires are effectively located, according to a preferred embodiment of the present invention, within the overall thickness of the assembly formed by the complementary layer and the semiconductor chip that constitutes the active layer.

The complementary layer covers substantially entirely or entirely the active face of the active layer except, of course, for the recesses. More specifically, the surface area of the active face of the active layer is substantially the same as the surface area of the first face of the complementary layer after subtracting the surface area corresponding to the recesses formed in said complementary layer. Therefore, it is possible to process the active layer so as to reduce its thickness down to the desired value. In addition, the active layer/complementary layer assembly is more resistant to the mechanical strains it may undergo, since the complementary layer protects the active layer.

Moreover, it should be noted that there are advantageously as many recesses as connection terminals in the semiconductor chip and that such recesses represent a reduced portion of the total surface area of the complementary layer.

For forming the electronic unit, the integrated circuit device 30 is attached to an insulating support 50 by means of a layer of adhesive material 52, the external face 54 of the insulating substrate being provided with external electrical contact pads 56. Windows such as window 58 are provided within the insulating substrate in front of each of pads 56. A lead wire 60, for example, made of gold, is attached, on the one hand, to the connection terminal 36 and, on the other hand, to the back face of an external electrical contact pad 56 through window 58. It should be understood that because of the very small thickness of active layer 32, terminals 36 are close to the insulating substrate 50. This allows for the whole bent lead wire 60 to be located below plane PP', which includes the upper face 44 of complementary layer 40.

The same would hold if the lead wires were replaced by elongated electrical connection elements.

In order to complete the electronic unit, the encapsulation 62 only needs to be formed, with its total thickness h reduced thanks to the above described provisions.

In the described implementation, the overall thickness h of the encapsulation is 310 μm if thickness of the adhesive layer between the substrate and the integrated circuit device is taken into account. The thickness $e_3$ of the insulating substrate being typically of 170 μm, the obtained electronic unit has a thickness of 480 μm. This represents a very large thickness reduction relative to standard electronic units.

Figure 4A:
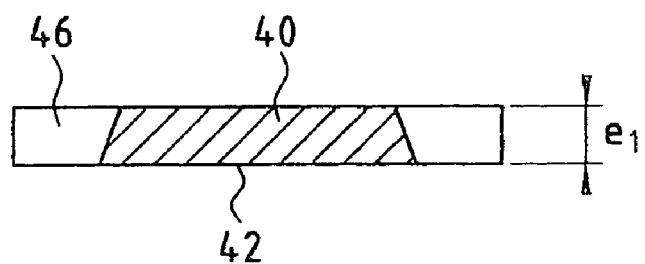
FIGS. 4a to 4c show the various steps of the method for manufacturing the integrated circuit device.
Figure 4B:
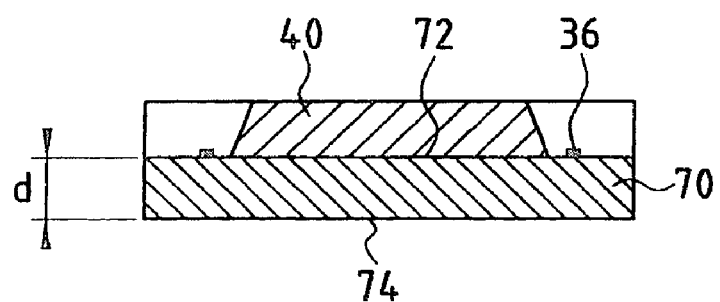
Figure 4C:
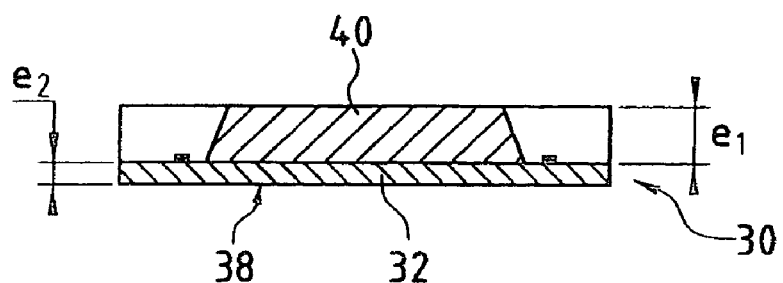

Referring now to FIGS. 4A, 4B and 4c, the main steps in the manufacture of integrated circuit device 30 will be explained.

In a first step shown in FIG. 4A, a silicon wafer is diced by means of any appropriate method allowing the complementary layer 40 to be formed with its recesses 46. This layer could be made of any other material. Its thickness $e_1$ preferably ranges from 100 to 200 μm.

Then, in a step shown in FIG. 4B, the complementary layer 40 is attached to the active face 72 of a semiconductor chip 50 provided with connection terminals 36. This chip has a standard thickness $\underline{d}$ of about 180 μm.

Finally, in a step shown in FIG. 4C, the non-active face 74 of chip 70 is processed by any appropriate method so as to reduce its thickness $e_2$ to a typical value of 40 μm, and active layer 32 is obtained.

Due to the presence of complementary layer 40, the integrated circuit device 30 has an overall thickness of about 180 μm in the considered example. One thus obtains a component of sufficient mechanical strength although the active layer 32 by itself has a thickness $e_2$ which does not provide such mechanical strength properties. Therefore, as already explained, the main advantage of the thus obtained component is that the contact terminals 36 are in very close proximity to the component attachment face 38.

The invention claimed is:

1. An integrated circuit device, comprising:
   an active chip of a semiconductor material comprising an electrical circuit, the active chip having an active face provided with a plurality of electrical connection terminals and a second face, wherein the chip has a thickness of less than 100 μm, and
   a complementary chip having a first face attached to the active face of the active chip, a second face and a side surface, wherein the complementary chip has a plurality of recesses, each recess extending through the whole thickness of the complementary chip and extending from above a contact terminal to said side surface, the complementary chip having a larger thickness than the active chip, wherein each recess extends laterally inward from a perimeter of the complimentary chip.

2. The integrated circuit device of claim 1, wherein the thickness of the active layer ranges from 5 to 50 μm.

3. The integrated circuit device of claim 2, wherein the thickness of the complementary layer ranges from 100 to 200 μm.

4. The integrated circuit device according to any of claims 1 to 3, wherein the complementary chip is formed with the same semiconductor material as the active chip.

5. The integrated circuit device of claim 1, wherein surface area of the first face of the complementary chip is substantially the same as surface area of the active face of the active chip.

6. An electronic unit for smart cards, comprising:
   an active chip of a semiconductor material comprising an electrical circuit, the active chip having an active face provided with a plurality of electrical connection terminals and a second face, wherein the chip has a thickness of less than 100 μm,
   a complementary chip having a first face attached to the active face of the active chip, a second face and a side surface, wherein the complementary chip has a plurality of recesses, each recess extending through the whole thickness of the complementary chip and extending from above a contact terminal to said side surface, the complementary chip having a larger thickness than the active chip, wherein each recess extends laterally inward from a perimeter of the complimentary chip,
   an insulating substrate having an outer face provided with outer electrical contact pads and an inner face, the second face of the active chip being attached to the substrate inner face, and
   a plurality of electrical leads, each lead having a first end connected to a contact terminal and a second end connected to an outer contact pad and lying entirely between the plane containing the second face of the complementary chip and the insulating substrate.

7. The electronic unit of claim 6, wherein the insulating substrate includes windows, each window being disposed above an outer electric contact pad.

8. A smart card comprising an electronic unit according to claim 6.

9. The electronic unit of claim 6, wherein surface area of the first face of the complementary chip is substantially the same as surface area of the active face of the active chip.

* * * * *